United States Patent
Kanbe

(10) Patent No.: US 10,622,298 B2
(45) Date of Patent: Apr. 14, 2020

(54) WIRING SUBSTRATE AND SEMICONDUCTOR DEVICE

(71) Applicant: SHINKO ELECTRIC INDUSTRIES CO., LTD., Nagano-shi, Nagano (JP)

(72) Inventor: Yoshihisa Kanbe, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 16/199,465

(22) Filed: Nov. 26, 2018

(65) Prior Publication Data

US 2019/0164879 A1    May 30, 2019

(30) Foreign Application Priority Data

Nov. 29, 2017    (JP) .................. 2017-229156

(51) Int. Cl.
*H01L 21/48*    (2006.01)
*H01L 23/498*    (2006.01)

(52) U.S. Cl.
CPC ...... *H01L 23/49866* (2013.01); *H01L 21/486* (2013.01); *H01L 21/4857* (2013.01); *H01L 23/49816* (2013.01); *H01L 23/49822* (2013.01); *H01L 23/49838* (2013.01); *H01L 2224/16225* (2013.01); *H01L 2224/32225* (2013.01); *H01L 2224/73204* (2013.01); *H01L 2924/15311* (2013.01)

(58) Field of Classification Search
CPC ........... H01L 23/49866; H01L 21/4857; H01L 21/486; H01L 23/49816; H01L 23/49822; H01L 23/49838; H01L 2224/16225; H01L 2224/32225; H01L 2224/73204; H01L 2924/15311
USPC .......................................... 257/762
See application file for complete search history.

(56) References Cited

U.S. PATENT DOCUMENTS

| | | | |
|---|---|---|---|
| 2011/0189848 A1* | 8/2011 | Ewert | C25D 3/32 438/612 |
| 2013/0313688 A1* | 11/2013 | Nomura | H01L 21/76877 257/621 |
| 2017/0179012 A1* | 6/2017 | Shimodaira | H01L 21/4853 |

FOREIGN PATENT DOCUMENTS

JP    2012-054295    3/2012

* cited by examiner

*Primary Examiner* — Hrayr A Sayadian
(74) *Attorney, Agent, or Firm* — Rankin, Hill & Clark LLP

(57) ABSTRACT

A wiring substrate includes a wiring, a solder resist layer formed on the wiring and having an opening from which a part of the wiring is exposed, a copper seed layer formed in the opening, a copper layer formed on the seed layer and filling the opening up to a certain depth thereof, and a metal post erected on the copper layer, having an upper surface located at a position higher than an upper surface of the solder resist layer and including any one of nickel, silver and tin.

4 Claims, 11 Drawing Sheets

WIRING SUBSTRATE AND SEMICONDUCTOR DEVICE

CROSS-REFERENCE TO RELATED APPLICATION

The present application claims priority from Japanese Patent Application No. 2017-229156 filed on Nov. 29, 2017, the entire content of which is incorporated herein by reference.

BACKGROUND

Technical Field

The present disclosure relates to a wiring substrate and a semiconductor device.

Related Art

There are a variety of terminals for interconnecting a semiconductor element such as an LSI (Large Scale Integration) and a wiring substrate. A solder bump may be exemplified. However, upon reflow, the solder bumps adjacent to each other may be bridged, so that it is not advantageous to narrow a pitch of the terminals.

In the meantime, there is a method of erecting metal posts as terminals on the wiring substrate and interconnecting the wiring substrate and the semiconductor element via the metal posts. In this case, since it is possible to interconnect upper surfaces of the metal posts and the semiconductor element via a small amount of solders, a bridge of the solders is difficult to be formed between the metal posts adjacent to each other, so that it is advantageous to narrow the pitch of the terminals.

However, there is a room for improvement on the metal post in terms of connection reliability between the wiring substrate and the semiconductor element.

Patent Document 1: JP-A-2012-54295

SUMMARY

Exemplary embodiments of the present invention provide a wiring substrate and a semiconductor device which can improve connection reliability between a semiconductor element and the wiring substrate.

A wiring substrate according to an exemplary embodiment comprises:
  a wiring;
  a solder resist layer formed on the wiring and having an opening from which a part of the wiring is exposed;
  a copper seed layer formed in the opening;
  a copper layer formed on the seed layer and filling the opening up to a certain depth thereof; and
  a metal post erected on the copper layer, having an upper surface located at a position higher than an upper surface of the solder resist layer and including any one of nickel, silver and tin.

Herein, the term "post" means an element with a shape of a pillar or column, whose cross-section is not limited to have a "circular shape" and can have any other shapes.

According to one aspect of the present disclosure, since the metal post contains any one of nickel, silver and tin, the etching rate of the metal post becomes slower than the etching rate of the seed layer. As a result, when wet-etching the seed layer, it is possible to reduce a risk that the metal post will be lost, to maintain strength of the metal post even after the wet etching is finished, and to improve connection reliability between the metal post and the semiconductor element.

DETAILED DESCRIPTION

Before describing an exemplary embodiment, the matters that have been examined by the inventors are described.

As described above, the metal post is advantageous to narrow a pitch of terminals. The inventors examined what kind of problems are to occur when a copper post is formed as the metal post.

FIGS. 1A to 5 are enlarged sectional views depicting manufacturing processes of a wiring substrate used for investigation.

Figure 1A:
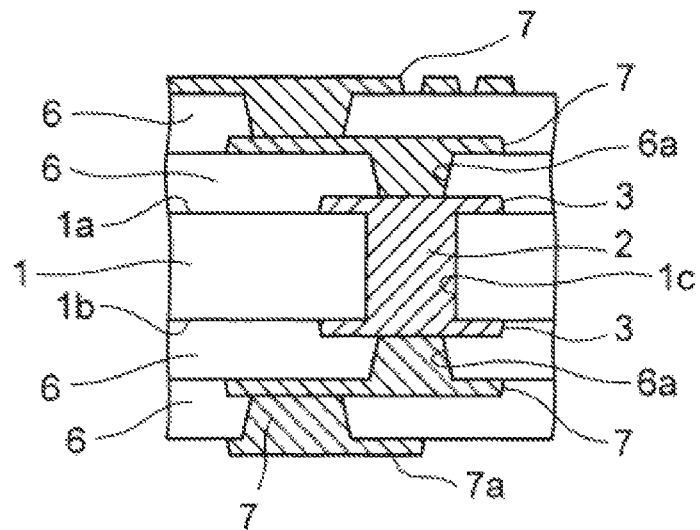
FIGS. 1A and 1B are sectional views depicting a manufacturing process of a wiring substrate used for investigation (1 thereof).

First, processes that are performed until a sectional structure shown in FIG. 1A is obtained are described.

A core base material 1 having a first principal surface 1a and a second principal surface 1b opposite to each other is prepared, and the core base material 1 is formed with a through-hole 1c by drilling or the like. As the core base material 1, a glass epoxy substrate in which epoxy resin is impregnated in glass cloth is used, for example.

Then, copper plated films are formed in the through-hole 1c and on the respective principal surfaces 1a, 1b, so that a through-electrode 2 is provided in the through-hole 1c and first wirings 3 are formed on the respective principal surfaces 1a, 1b around the through-electrode 2.

In addition, an insulation layer 6 such as a phenol resin, a polyimide resin and the like is formed on the first wiring 3 and is then formed therein with a via hole 6a reaching the first wiring 3 by laser processing.

Then, a copper plated layer is formed on the insulation layer 6 and in the via hole 6a, and is then patterned to form a second wiring 7.

Thereafter, the insulation layer 6 and the second wiring 7 are alternately stacked in plural, so that a multi-layered wiring structure having the insulation layers 6 and the second wirings 7 is obtained, as shown in FIG. 1A.

In the meantime, the second wiring 7 of the bottom layer at the second principal surface 1b-side is formed with a land 7a to which a solder bump is to be joined later. The land 7a is electrically connected to the second wiring 7 of the top layer at the first principal surface 1a-side via the plurality of second wirings 7 and the through-electrode 2.

Figure 1B:
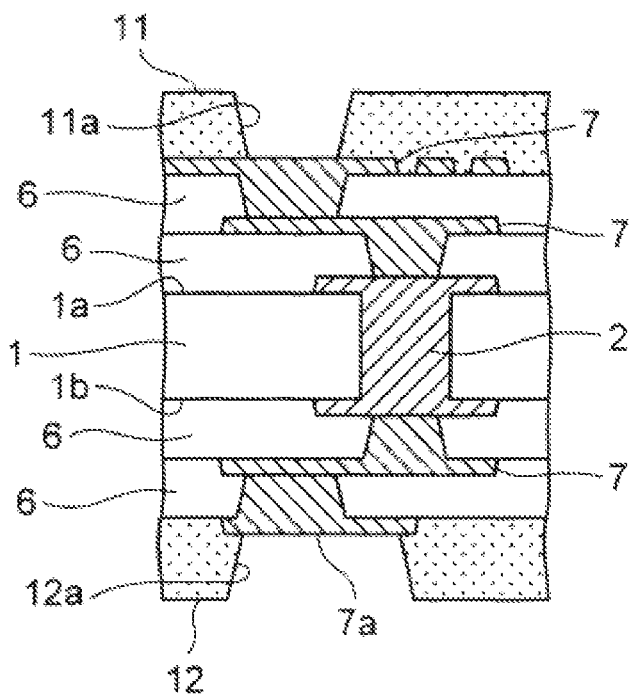

Then, as shown in FIG. 1B, a first solder resist layer 11 is formed on the insulation layer 6 and the second wiring 7 at the first principal surface 1a-side, and a first opening 11a is formed in the first solder resist layer 11 by the laser processing to expose a part of the second wiring 7.

Likewise, a second solder resist layer 12 is formed on the insulation layer 6 and the land 7a of the bottom layer at the second principal surface 1b-side, and a second opening 12a is formed in the second solder resist layer 12 by the laser processing to expose a part of the land 7a.

In the meantime, photosensitive resin layers may be formed as the respective solder resist layers 11, 12, and the photosensitive resin layers may be exposed and developed to form the openings 11a, 12a.

Figure 2A:
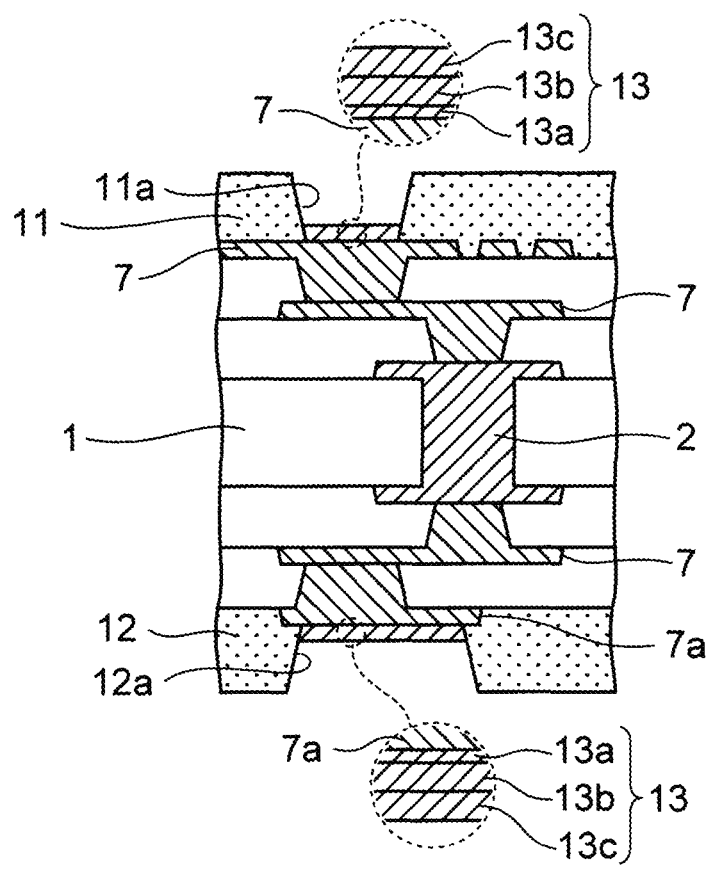
FIGS. 2A and 2B are sectional views depicting a manufacturing process of the wiring substrate used for investigation (2 thereof).

Then, as shown in FIG. 2A, a nickel layer 13a, a palladium layer 13b, and a gold layer 13c are formed in corresponding order on each surface of the second wiring 7 and the land 7a exposed from the respective openings 11a, 12a by an electroless plating method, so that a stacked film thereof is formed as a first diffusion preventing layer 13.

The first diffusion preventing layer 13 formed on the land 7a is a metal layer for increasing joining strength with a solder bump to be joined thereon later and preventing solder from diffusing into the land 7a, and is also referred to as UBM (Under Barrier Metal).

Plating conditions of the first diffusion preventing layer 13 are not particularly limited. For example, the nickel layer 13a may be formed to have a thickness of about 5 µm to 10 µm under conditions of liquid temperature of 75° C. to 85° C. and plating time of about 40 minutes while using a water solution of nickel sulfate, carboxylate, sodium hypophosphite and sulfur compound, as a plating solution.

Also, as a plating solution of the palladium layer 13b, a water solution of di chloro tetraammine palladium, aminocarboxylic acid, amine compound, sodium hypophosphite and inorganic chloride may be used, for example. The palladium layer 13b is formed to have a thickness of about 20 nm to 100 nm under conditions that a liquid temperature of the plating solution is 45° C. to 55° C. and plating time is about 5 minutes.

Also, as a plating solution of the gold layer 13c, a water solution of gold potassium cyanide, potassium cyanide, aminocarboxylate, amine compound, phosphate, sulfonate and formaldehyde may be used, for example. The gold layer 13c is formed to have a thickness of about 20 nm to 100 nm under conditions that a liquid temperature of the plating solution is 80° C. to 85° C. and plating time is about 15 minutes.

Figure 2B:
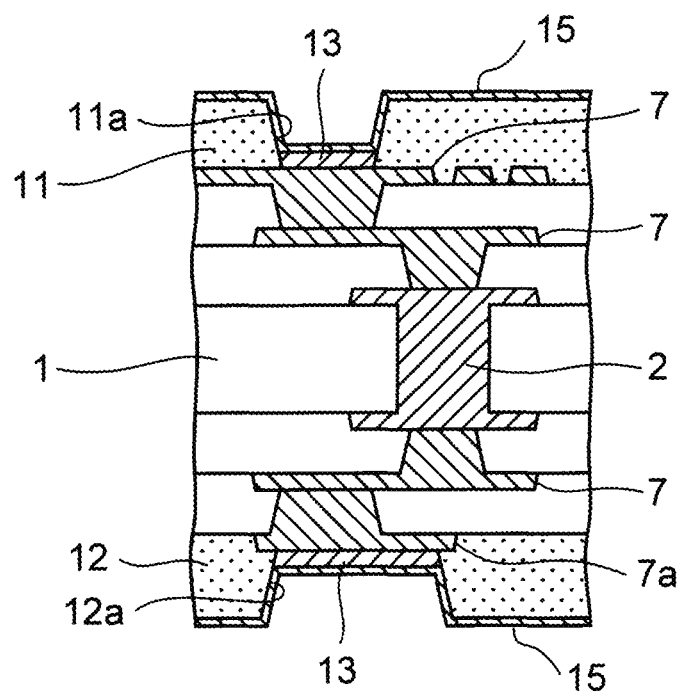

Subsequently, as shown in FIG. 2B, an electroless copper plated layer as a seed layer 15 is formed in each of the openings 11a, 12a and on each of the respective solder resist layers 11, 12.

Film formation conditions of the seed layer are not particularly limited. For example, the seed layer 15 is formed to have a thickness of about 0.5 µm to 1 µm under conditions of liquid temperature of 30° C. to 40° C. and plating time of about 15 minutes while using a water solution of copper sulfate, sodium hydroxide, carboxylate, nickel sulfate and formaldehyde, as a plating solution.

Figure 3A:
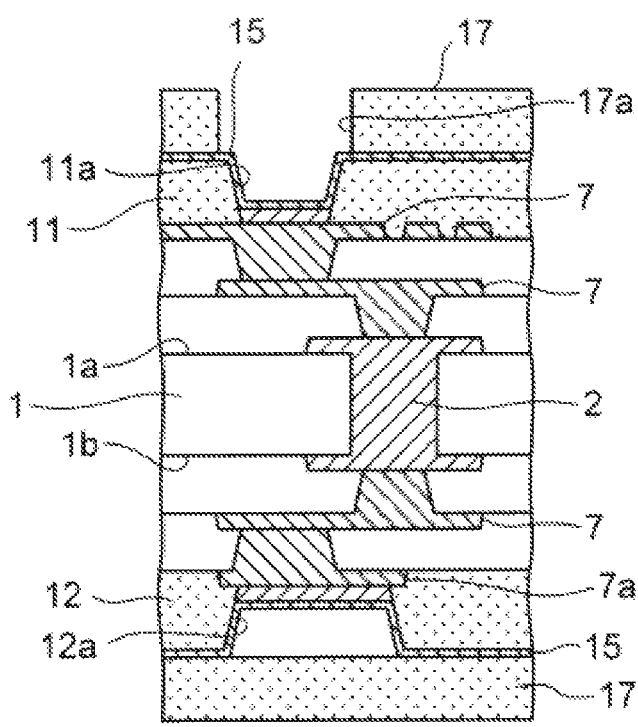
FIGS. 3A and 3B are sectional views depicting a manufacturing process of the wiring substrate used for investigation (3 thereof).

Subsequently, as shown in FIG. 3A, a dry film resist is bonded on the seed layer 15, as a plated resist layer 17. Then, the plated resist layer 17 is exposed and developed, so that an opening 17a is formed in the plated resist layer 17 at the first principal surface 1a-side so that a position of the opening 17a as viewed from the top is overlapped with a position of the first opening 11a.

On the other hand, an overall surface of the seed layer 15 at the second principal surface 1b-side is covered with the plated resist layer 17.

Figure 3B:
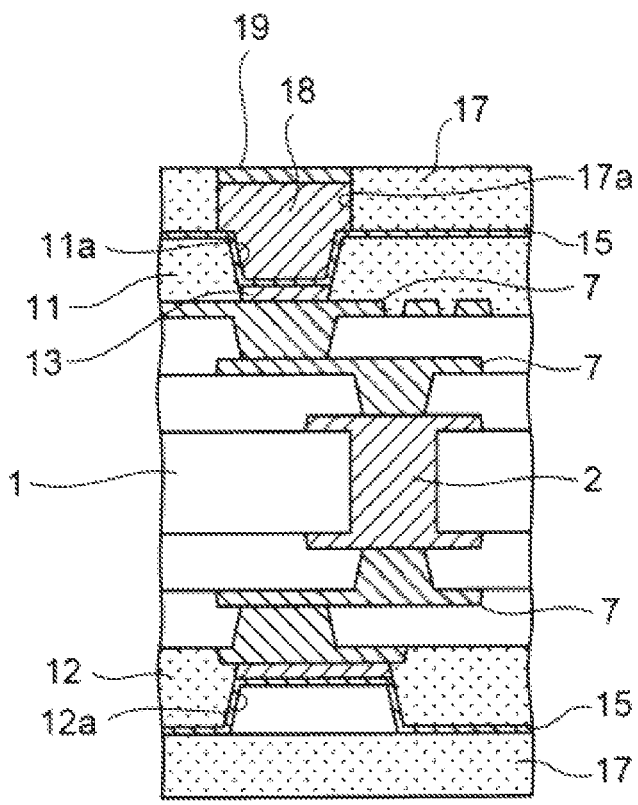

Also, as shown in FIG. 3B, a copper layer is grown on the seed layer 15 exposed from the opening 17a by an electrolytic plating method while feeding power to the seed layer 15, so that the copper layer is formed as a copper post 18.

After that, a second diffusion preventing layer 19 is formed on an upper surface of the copper post 18 by the electroless plating method. Like the first diffusion preventing layer 13, a stacked film of a nickel layer, a palladium layer and a gold layer stacked in corresponding order is adopted as the second diffusion preventing layer 19.

Figure 4A:
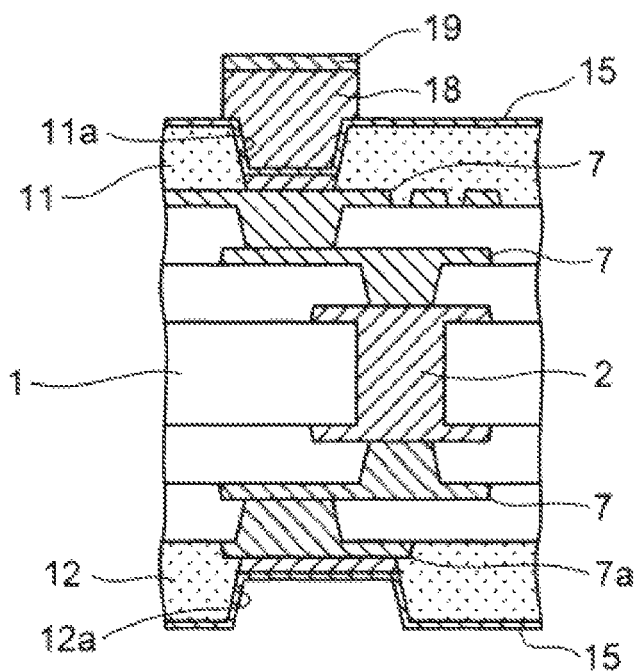
FIGS. 4A and 4B are sectional views depicting a manufacturing process of the wiring substrate used for investigation (4 thereof).

Subsequently, as shown in FIG. 4A, the plated resist layers 17 are peeled off.

Figure 4B:
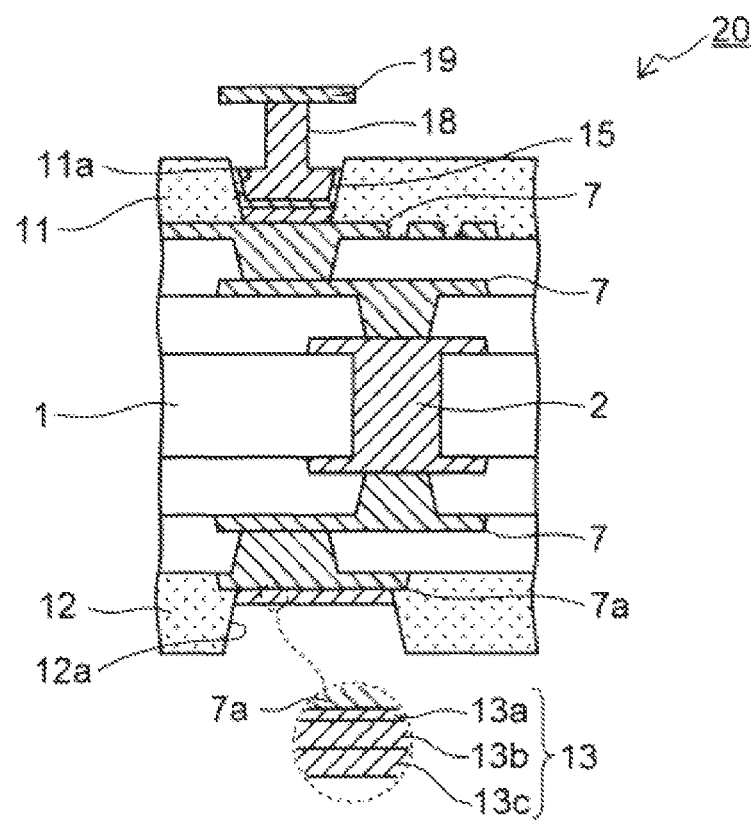

Then, as shown in FIG. 4B, the extra seed layers 15 on the respective solder resist layers 11, 12 and in the second opening 12a are wet-etched and removed by using a sulfuric acid and hydrogen peroxide mixture as an etching solution, so that the seed layer 15 is left only below the copper post 18. This patterning method of the seed layer 15 is referred to as a semi-additive method.

Since the seed layer 15 is removed from the above of the land 7a upon completion of the wet etching, the gold layer 13c, which is the top layer of the first diffusion preventing layer 13, is exposed to the etching solution and the copper post 18 is also exposed to the etching solution. At this time, a galvanic phenomenon occurs between the copper post 18 and the gold layer 13c electrically connected thereto, due to different ionization tendencies of the copper post 18 and the gold layer 13c.

The galvanic phenomenon is a phenomenon that when two metals having different ionization tendencies are put in an electrolytic solution, a local battery is formed by both the metals and the metal having a larger ionization tendency is corroded. In this example, since the copper post 18 has the larger ionization tendency than the gold layer 13c, the copper post 18 is excessively etched in the etching solution, so that side surfaces of the copper post 18 are largely retreated.

By the above processes, a basic structure of a wiring substrate 20 used for investigation is completed.

Figure 5:
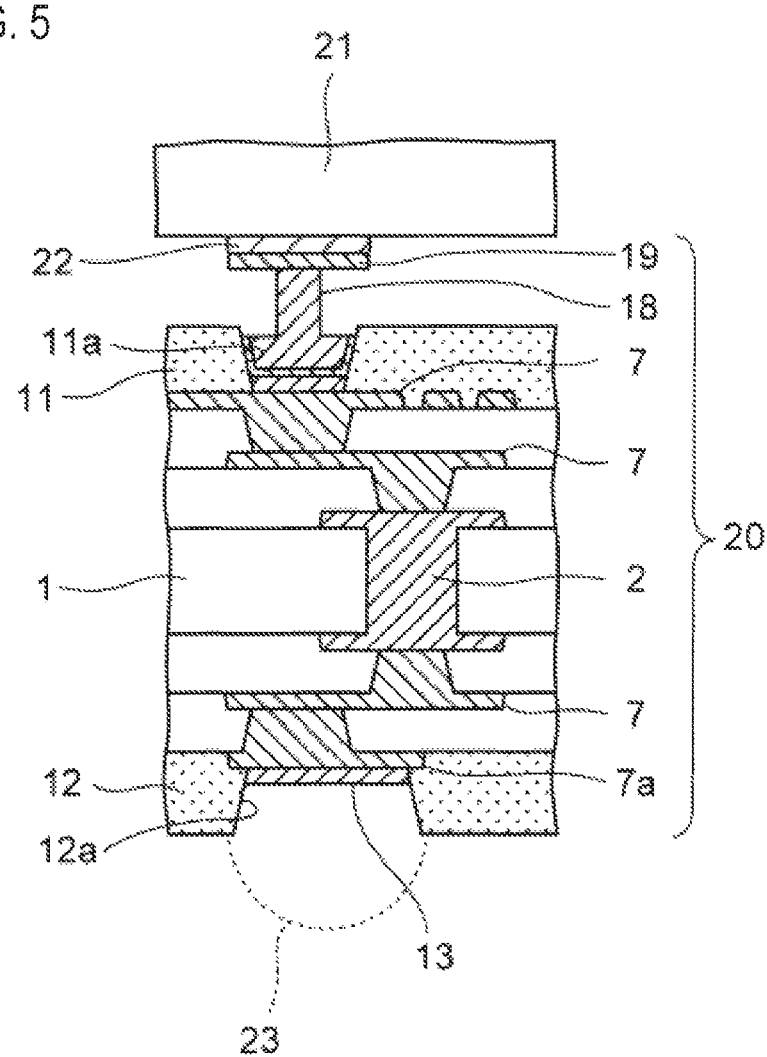
FIG. 5 is a sectional view depicting a manufacturing process of the wiring substrate used for investigation (5 thereof).

Thereafter, as shown in FIG. 5, while pressing a semiconductor element 21 to the wiring substrate 20, the second diffusion preventing layer 19 and the copper post 18 are connected to the semiconductor element 21 via a solder 22. Also, as required, a solder bump 23 is mounted to the first diffusion preventing layer 13 in the second opening 12a, and the solder bump 23 is reflowed and joined to the land 7a.

At this time, the gold layer 13c (refer to FIG. 4B) that can be easily alloyed with the solder is formed as the top layer of the first diffusion preventing layer 13, so that it is possible to improve bonding strength of the solder bump 23 to the land 7a. Also, it is possible to prevent the melted solder from diffusing into the land 7a by the nickel layer 13a.

According to the above-described method of manufacturing the wiring substrate 20, when wet-etching the seed layer 15 in the process of FIG. 4B, the side surfaces of the copper post 18 are excessively etched by the galvanic phenomenon. Thereby, the strength of the copper post 18 is lowered, and the copper post 18 is bent due to a pressure upon the mounting of the semiconductor element 20 in the process of FIG. 5. In the worst case, the copper post 18 is lost in the process of FIG. 4B, so that connection reliability between the wiring substrate 20 and the semiconductor element 21 is lowered.

Hereinafter, an exemplary embodiment for improving the connection reliability between the wiring substrate and the semiconductor element is described.

Exemplary Embodiment

A wiring substrate of an exemplary embodiment is described in conformity to manufacturing processes thereof.

FIGS. 6A to 8B are sectional views depicting manufacturing processes of a wiring substrate of the exemplary embodiment.

In FIGS. 6A to 8B, the same elements as those in FIGS. 1A to 5 are denoted with the same reference numerals as those in FIGS. 1A to 5, and the descriptions thereof are omitted.

Figure 6A:
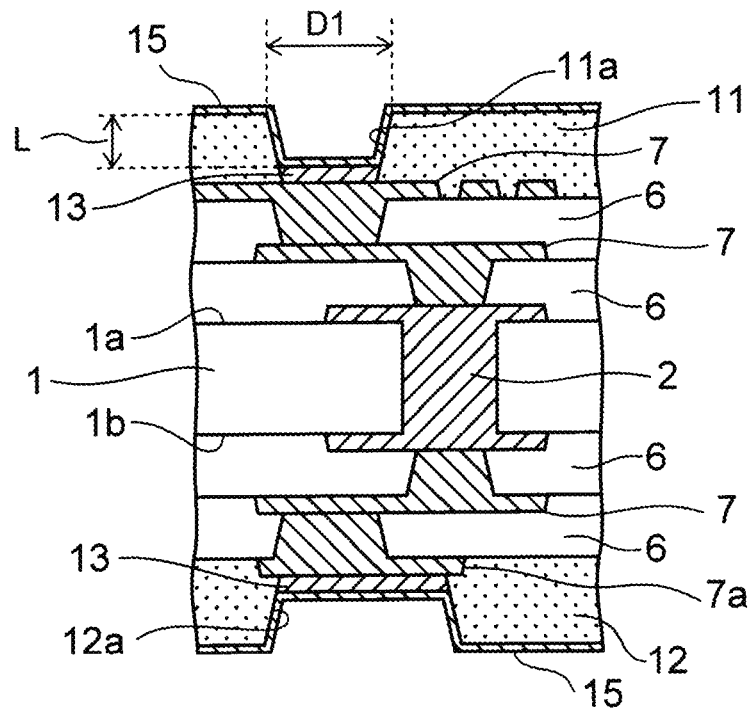
FIGS. 6A and 6B are sectional views depicting a manufacturing process of a wiring substrate in accordance with an exemplary embodiment (1 thereof).

First, the processes of FIGS. 1A to 2B are performed, so that a structure where the copper seed layers 15 having a thickness of about 0.5 μm to 1 μm are formed on the respective solder resist layers 11, 12 and in the respective openings 11a, 12a is manufactured, as shown in FIG. 6A.

In the exemplary embodiment, the first opening 11a is formed to have a tapered shape with a diameter increasing upward, so as to easily fill the first opening 11a with a copper layer. A size of the first opening 11a is not particularly limited. However, in the exemplary embodiment, a diameter D1 of an opening end of the first opening 11a is set to about 20 μm to 50 μm, and a depth L of the first opening 11a is set to about 10 μm to 25 μm.

Also, a thickness of the respective solder resist layers 11, 12 is about 10 μm to 25 μm on the second wiring 7 or the land 7a, and is about 20 μm to 40 μm on the insulation layer 6.

Also, the land 7a is electrically connected to the second wiring 7, which is the top layer of the first principal surface 1a-side, via the plurality of second wirings 7 and the through-electrode 2.

Figure 6B:
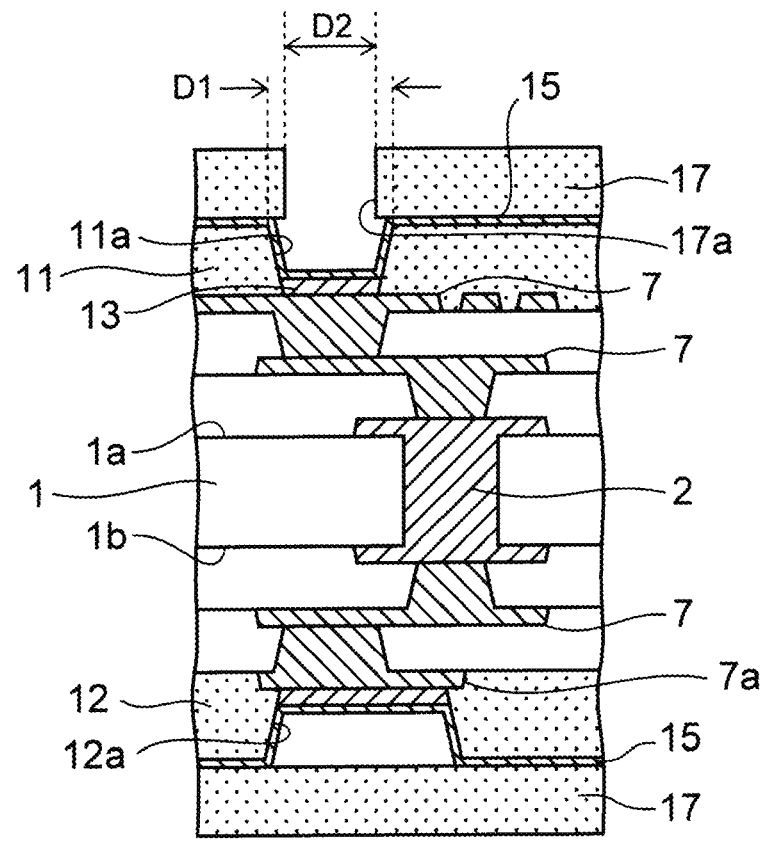

Then, as shown in FIG. 6B, a dry film resist as a plated resist layer 17 is bonded on the seed layer 15. Then, the plated resist layer 17 is exposed and developed, so that the plated resist layer 17 at the first principal surface 1a-side is formed therein with an opening 17a.

The opening 17a is formed at a position overlapping the first opening 11a as viewed from the top, and a diameter D2 thereof is set to about 15 μm to 45 μm smaller than the diameter D1 of the opening end of the first opening 11a.

On the other hand, an overall surface of the seed layer 15 at the second principal surface 1b-side is covered with the plated resist layer 17.

Figure 7A:
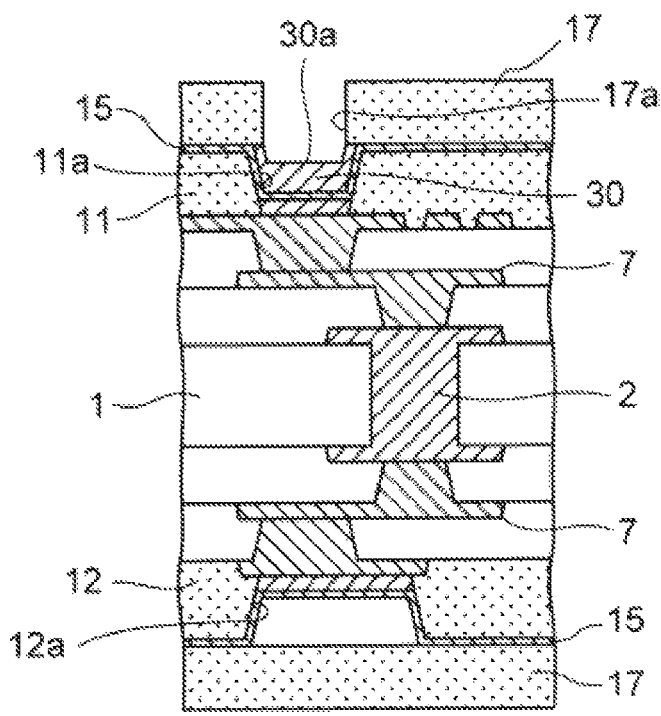
FIGS. 7A and 7B are sectional views depicting a manufacturing process of the wiring substrate in accordance with the exemplary embodiment (2 thereof).

Then, as shown in FIG. 7A, while feeding DC current to the seed layer 15, a copper layer 30 is formed on the seed layer 15 exposed from the opening 17a by the electrolytic plating, so that the first opening 11a is filled up to a certain depth thereof with the copper layer 30 so that at least a lower part of the first opening 11a is filled with the copper layer 30 while the entire of the first opening 11a is not filled with the copper layer 30. The certain depth is small than the depth L.

In other words, the first opening 11a is filled up between an upper end and a lower end of the first opening 11a with the copper layer 30. The copper is deposited on the surface of the seed layer 15 by performing an electrolytic plating while feeding power to the seed layer 15, so that the copper layer 30 is formed. Therefore, the inner wall surface of the seed layer 15 which is not filled with the copper layer 30 at an upper part of the first opening 11a is covered by the film-like copper layer 30.

Although the plating conditions of the copper layer 30 are not particularly limited, a solution in which copper sulfate is dissolved in sulfuric acid is used as the plating solution, in the exemplary embodiment. A shape of an upper surface 30a of the copper layer 30 can be controlled by adding appropriate amounts of an electrocrystallization promoting component and an electrocrystallization suppressing component to the plating solution. For example, when the electrocrystallization promoting component of organic sulfur compound and the electrocrystallization suppressing component of amine compound are added to the plating solution, promotion and suppression of growth of the copper layer 30 are controlled, so that the upper surface 30a can be made flat.

Also, a liquid temperature of the plating solution is set to 20° C. to 25° C., and plating time is set to about 80 minutes, for example.

Figure 7B:
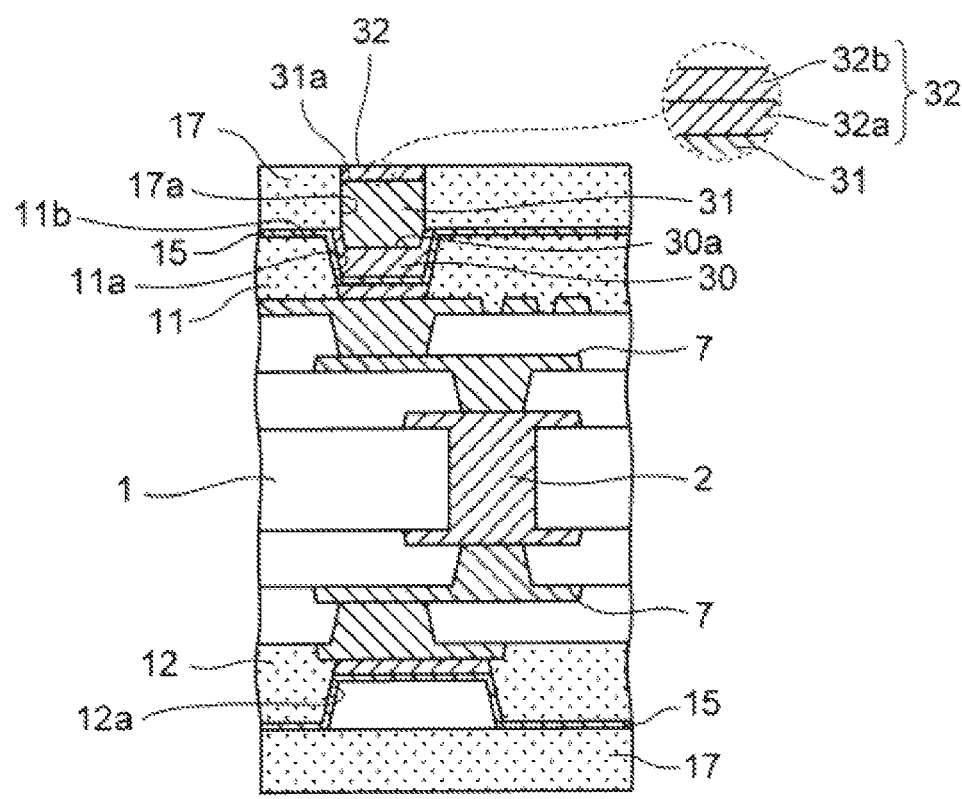

Subsequently, as shown in FIG. 7B, DC current is fed to the seed layer 15 while using a mixed solution of nickel chloride and boric acid as the plating solution, so that a nickel layer is grown as a metal post 31 on the copper layer 30 exposed from the opening 17a. As the plating conditions thereof, a liquid temperature of the plating solution is set to 45° C. to 55° C., and plating time is set to about 30 minutes, for example.

At this time, as described above, since the first opening 11a is beforehand filled up to the certain depth thereof with the copper layer 30, it is not necessary to fill the entire first opening 11a with the metal post 31. Particularly, since nickel, which is a material of the metal post 31, is a material that is more difficult to be filled in the first opening 11a than copper and the upper surface 31a of the metal post 31 is difficult to be flattened when the copper layer 30 is omitted, it is advantageous to beforehand fill the first opening 11a with the copper layer 30. A portion which is equal or more than 50% of the depth L of the first opening 11a is filled with the copper layer 30. Especially, if the portion which is equal or more than 80% of the depth L of the first opening 11a is filled with the copper layer 30, the metal post 31 is easily formed by nickel and the like.

Further, as described above, the electrocrystallization promoting component and the electrocrystallization suppressing component are appropriately added to the plating solution for forming the copper layer 30, so that the upper surface 30a of the copper layer 30 is flattened and the upper surface 31a of the metal post 31 is also flattened in conformity to the shape of the upper surface 30a.

A height of the metal post 31 is not particularly limited inasmuch as the upper surface 31a is higher than an upper surface 11b of the first solder resist layer 11. For example, the metal post 31 is formed so that the upper surface 31a is positioned at a height of about 5 μm to 30 μm when measured from the upper surface 11b.

Also, a diameter of the metal post 31 is about 15 μm to 45 μm, which is the same as the opening 17a, and is smaller than the diameter D1 (refer to FIG. 6B) of the opening end of the first opening 11a.

In the meantime, the material of the metal post 31 is not limited to nickel. For example, the metal post 31 may be formed of any one of nickel, silver and tin. Alternatively, the metal post 31 may be formed of alloy including any one of the metals.

Thereafter, the DC current is fed to the seed layer 15, so that a palladium layer 32a and a gold layer 32b are formed in corresponding order on the metal post 31 by the electrolytic plating method and a stacked film thereof is formed as a second diffusion preventing layer 32.

The palladium layer 32a is formed to have a thickness of about 20 nm to 200 nm under conditions that a water solution including di chloro tetraammine palladium and ammonium dihydrogen phosphate is used as the plating solution, a liquid temperature of the plating solution is 45° C. to 55° C. and plating time is about one minute.

Also, the gold layer 32b is formed to have a thickness of about 20 nm to 200 nm under conditions that a water solution including gold (I) potassium cyanide and thallium acetate is used as the plating solution, a liquid temperature of the plating solution is 50° C. to 60° C. and plating time is about two minutes.

Figure 8A:
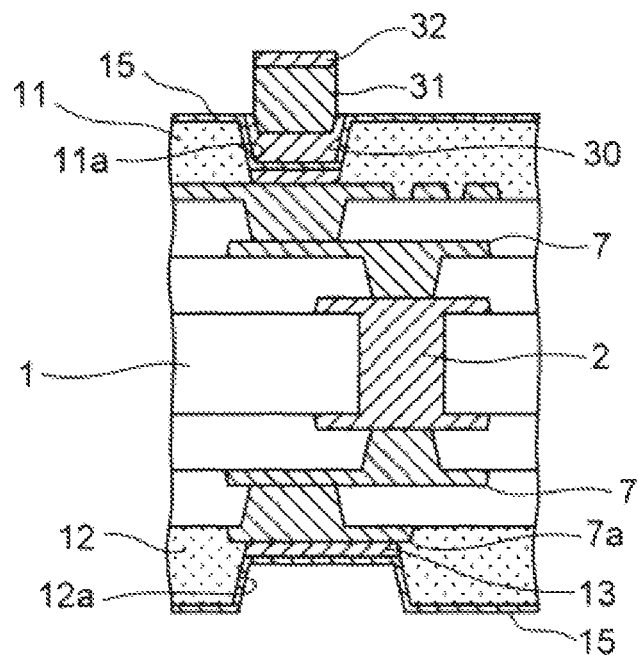
FIGS. 8A and 8B are sectional views depicting a manufacturing process of the wiring substrate in accordance with the exemplary embodiment (3 thereof).

Thereafter, as shown in FIG. 8A, the plated resist layers 17 are removed.

Figure 8B:
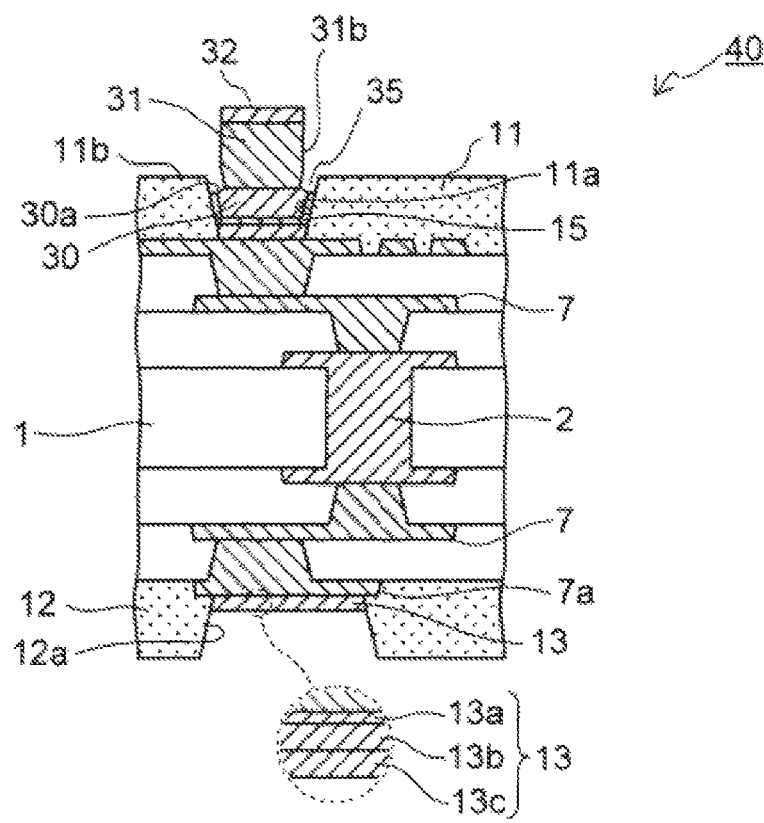

Subsequently, as shown in FIG. 8B, the extra seed layers 15 on the respective solder resist layers 11, 12 and in the second opening 12a are wet-etched and removed by using a sulfuric acid and hydrogen peroxide mixture as an etching solution.

At this time, in the exemplary embodiment, since the metal post 31 is formed of nickel of which an etching rate is slower than copper with respect to the sulfuric acid and hydrogen peroxide mixture, side surfaces 31b of the metal post 31 can be suppressed from being etched due to the etching. In the meantime, even when the metal post 31 is formed of silver or tin instead of nickel or the metal post 31 is formed of alloy including any one of nickel, silver and tin, it is possible to suppress the metal post 31 from being etched by the same reason.

Also, during the wet etching, the copper layer 30 and the gold layer 13c on the land 7a, which are electrically connected, are simultaneously exposed to the sulfuric acid and hydrogen peroxide mixture, so that the galvanic phenomenon occurs. In the exemplary embodiment, by using the galvanic phenomenon, the copper layer 30 is intentionally wet-etched to lower the upper surface 30a of the copper layer 30 around the metal post 31 than the upper surface 11b of the first solder resist layer 11, so that a concave portion 35 is formed around the metal post 31.

By the above processes, a basic structure of a wiring substrate 40 in accordance with the exemplary embodiment is completed.

Figure 9:
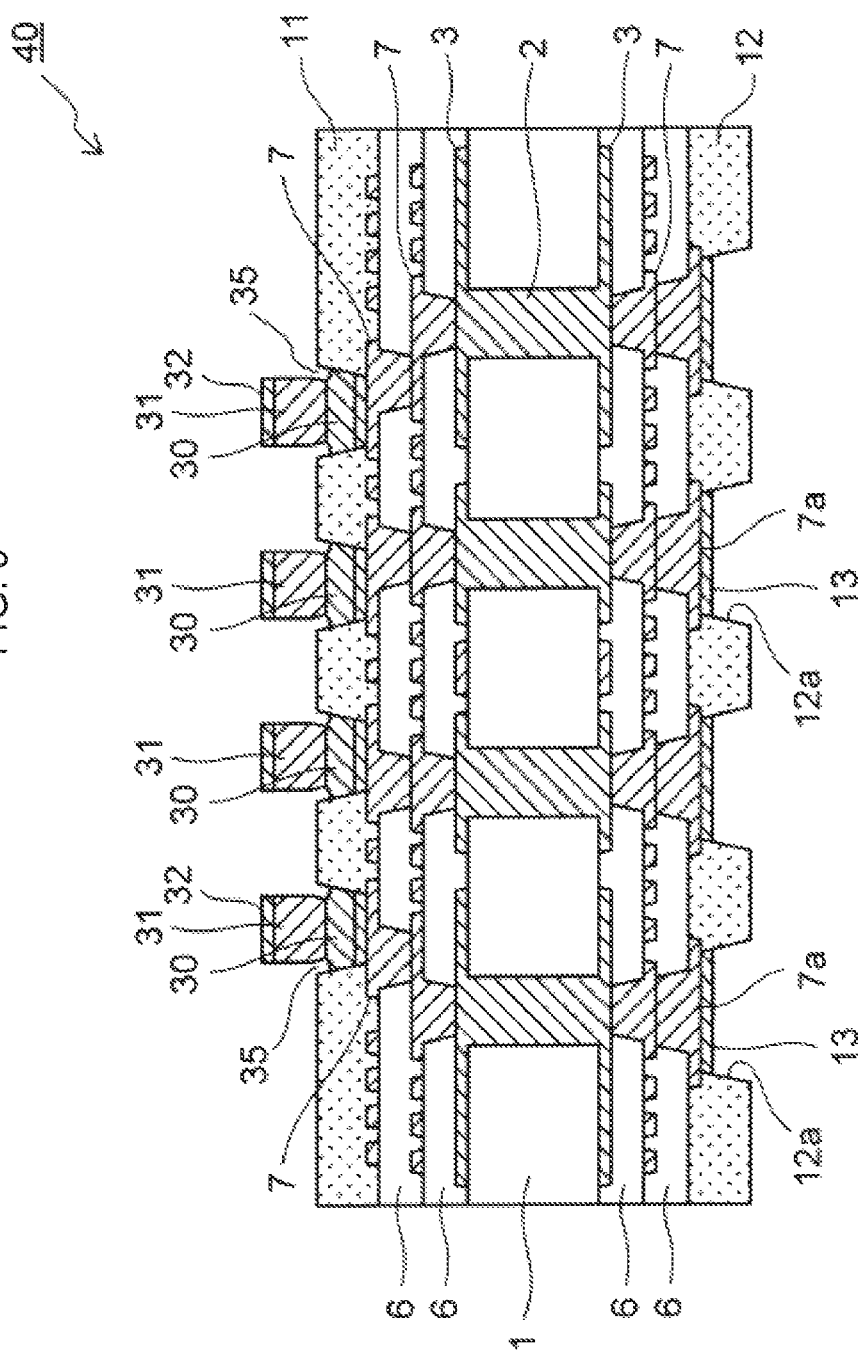
FIG. 9 is an overall sectional view of the wiring substrate in accordance with the exemplary embodiment.

FIG. 9 is an overall sectional view of the wiring substrate 40.

As shown in FIG. 9, a plurality of the metal posts 31 is erected above the core base material 1.

Following processes of the above are described with reference to FIGS. 10 and 11.

Figure 10:
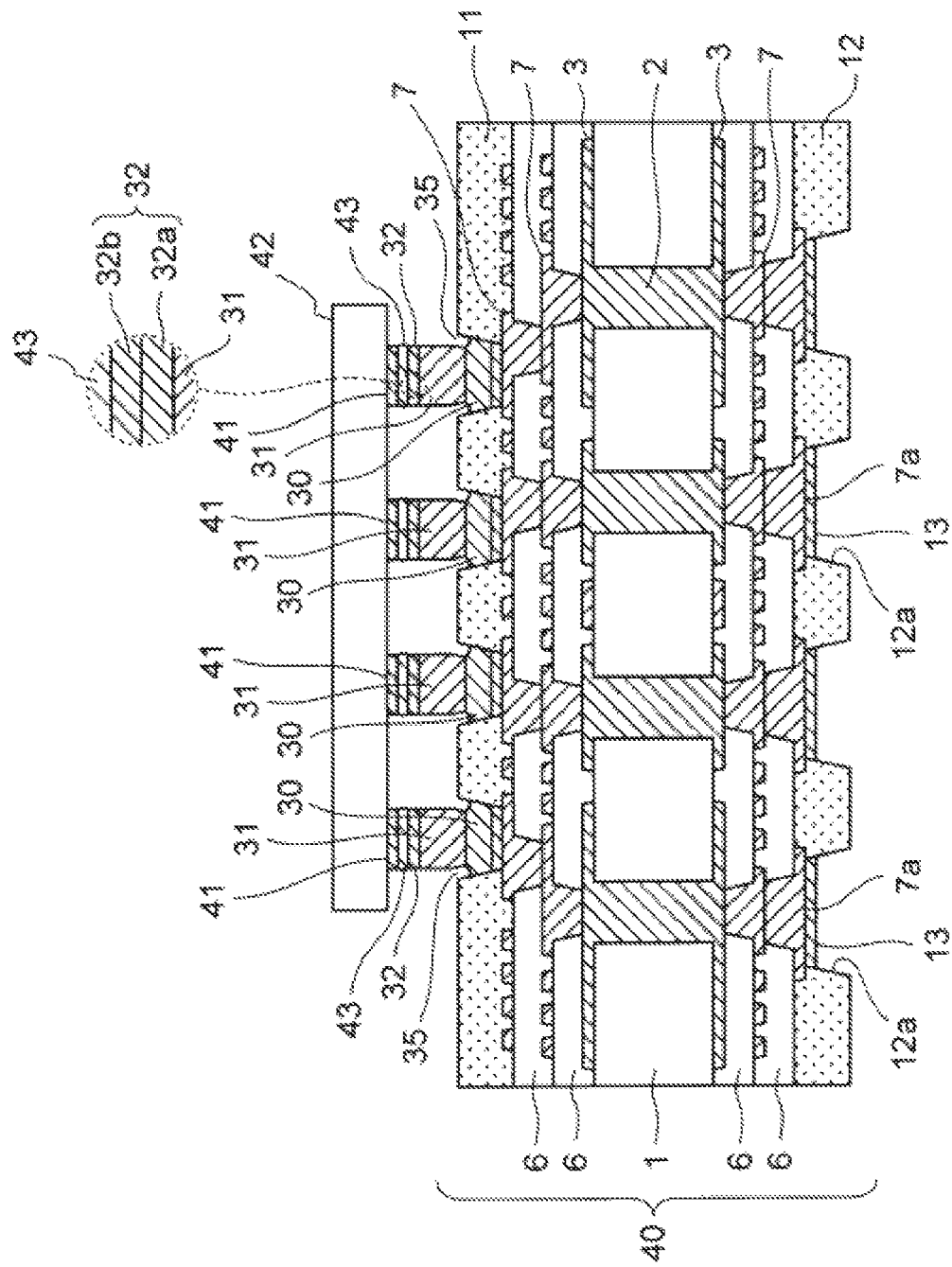
FIG. 10 is an overall sectional view depicting a manufacturing process of a semiconductor device in accordance with the exemplary embodiment (1 thereof).
Figure 11:
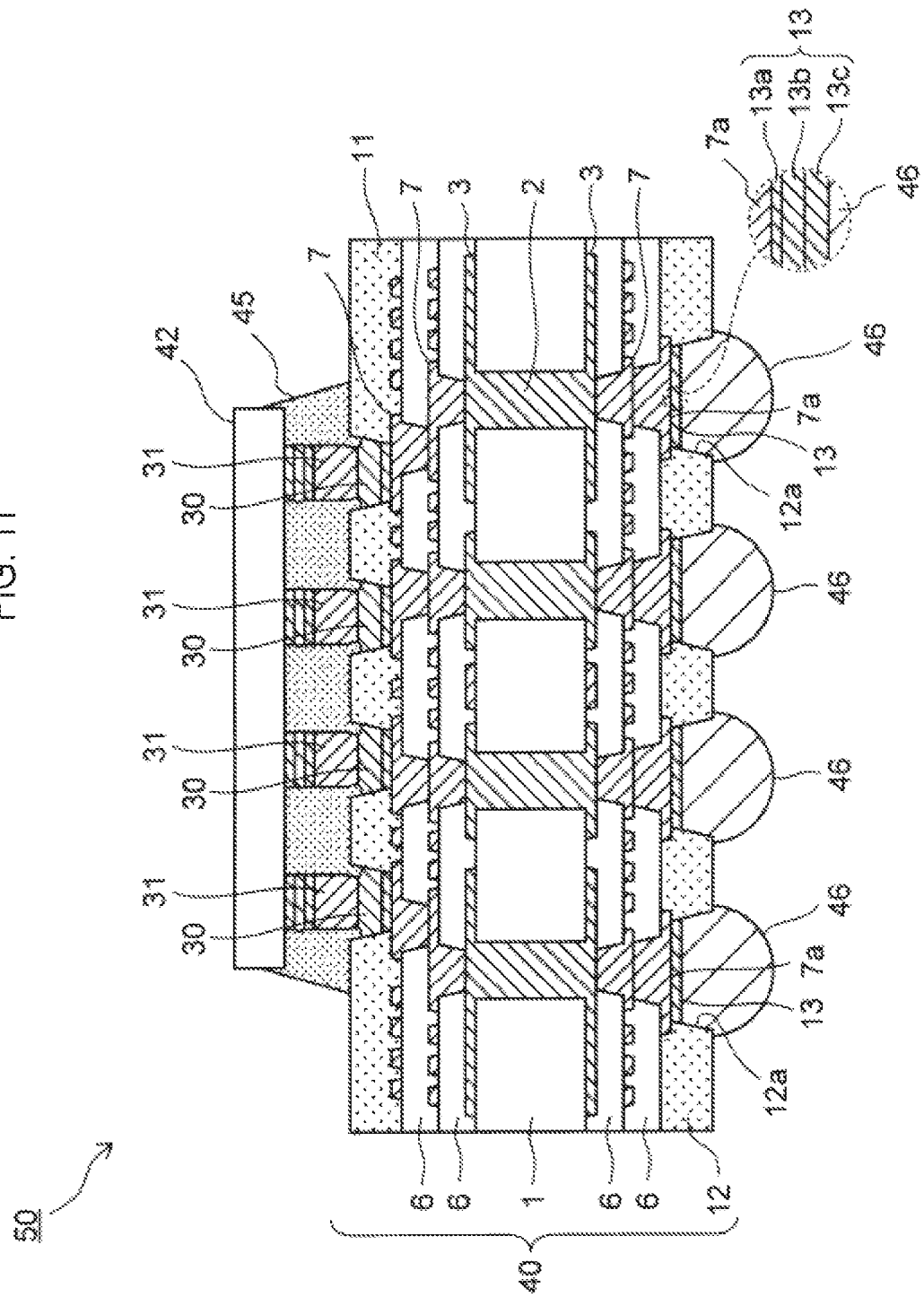
FIG. 11 is an overall sectional view depicting a manufacturing process of the semiconductor device in accordance with the exemplary embodiment (2 thereof).

FIGS. 10 and 11 are overall sectional views depicting manufacturing processes of a semiconductor device in accordance with the exemplary embodiment.

First, as shown in FIG. 10, a semiconductor element 42 having a plurality of electrodes 41 is prepared, and the electrodes 41 and the metal posts 31 are positionally aligned. Then, solders 43 are provided between the electrodes 41 and the metal posts 31, and are reflowed and melted at a temperature lower than a melting point of the metal post 31, so that the wiring substrate 40 and the semiconductor element 42 are electrically and mechanically connected via the metal posts 31.

Since the metal posts 31 are not melted during the reflow, there are little concerns that the electrodes 41 adjacent to each other will be electrically shorted due to the melted solders, unlike a case where solder bumps are used instead of the metal posts 31.

Further, since the solders 43 melted by the reflow flow down along the side surfaces of the metal posts 31 and are stagnant in the concave portions 35, it is possible to suppress a situation where the solders 43 wettably spread around the metal posts 31. Therefore, it is possible to further reduce the risk that the metal posts 31 adjacent to each other will be electrically shorted due to the solders 43.

In the meantime, as shown in a dotted circle, since the gold layer 32b of the second diffusion preventing layer 32 is easily alloyed with the solder 43, it is possible to increase connection strength of the metal post 31 and the semiconductor element 42. Also, it is possible to suppress a situation where nickel contained in the metal post 31 diffuses into the gold layer 32b by the palladium layer 32a.

Subsequently, as shown in FIG. 11, an underfill resin 45 is filled between the first solder resist layer 11 and the semiconductor element 42, so that the connection strength of the wiring substrate 40 and the semiconductor element 42 is reinforced by the underfill resin 45.

Thereafter, solder bumps 46 are mounted on the first diffusion preventing layer 13 exposed from the second openings 12a, and the solder bumps 46 are reflowed and are thus joined to the lands 7a. During the reflow, since the solder bump 46 wettably spreads on the surface of the gold layer 13c and is easily alloyed with gold, it is possible to increase the joining strength of the solder bump 46 to the land 7a.

Also, it is possible to prevent a situation where the melted solder diffuses into the land 7a by the nickel layer 13a and the palladium layer 13b. In the meantime, the palladium layer 13b and the gold layer 13c are eluted into the solder bump 46 at a point of time at which the reflow is over.

By the above processes, a basic structure of a semiconductor device 50 in accordance with the exemplary embodiment is completed.

According to the exemplary embodiment as described above, any one of nickel, silver and tin is adopted as the material of the metal post 31, so that the metal post 31 is suppressed from being etched upon the wet etching of the seed layer 15 in the process of FIG. 8B. For this reason, it is possible to reduce a risk that the metal post 31 will be lost due to the wet etching and to maintain the strength of the metal post 31 even after the wet etching is finished. Accordingly, it is possible to improve the connection reliability between the wiring substrate 40 and the semiconductor element 42.

Also, since the first opening 11a is beforehand filled up to the certain depth thereof with the copper layer 30, it is not necessary to fill the entire first opening 11a with the metal post 31 formed of nickel that is more difficult to fill the first opening 11a than copper. Accordingly, it is possible to easily form the metal post 31.

This disclosure further encompasses various exemplary embodiments, for example, described below.

1. A method of manufacturing a wiring substrate, the method comprising:
   forming a solder resist layer on a wiring;
   forming the solder resist layer with an opening exposing a part of the wiring;

forming a copper seed layer on the solder resist layer and in the opening;

forming, on the seed layer, a plated resist layer having an opening so that a position of the opening is overlapped with a position of the opening of the solder resist layer as viewed from the top;

forming a copper layer on the seed layer exposed from the opening of the plated resist layer by an electrolytic plating while feeding power to the seed layer, thereby filling the opening of the solder resist layer up to a certain depth thereof with the copper layer;

forming, on the copper layer exposed from the opening of the plated resist layer, a metal post comprising any one of nickel, silver and tin and having an upper surface at a position higher than an upper surface of the solder resist layer by the electrolytic plating while feeding power to the seed layer;

removing the plated resist layer, and wet etching and removing the seed layer on the solder resist layer by using an etching solution in which an etching rate of the metal post is slower than an etching rate of copper, after removing the plated resist layer.

2. The method of manufacturing a wiring substrate according to claim 1, wherein a diameter of the metal post is smaller than a diameter of an opening end of the opening of the solder resist layer, and wherein in the wet etching and removing the seed layer, the copper layer around the metal post is wet-etched, so that an upper surface of the copper layer around the metal post is made lower than the upper surface of the solder resist layer.

3. The method of manufacturing a wiring substrate according to claim 1 or 2, further comprising:

forming the wiring above a base material, wherein the base material has a first principal surface on which the wiring is formed and a second principal surface opposite to the first principal surface, forming a land electrically connected to the wiring at the second principal surface-side, forming a metal layer having an ionization tendency smaller than copper on a surface of the land, and wherein in the wet etching and removing the seed layer, the seed layer is wet-etched with the etching solution in a state where the metal layer is exposed to the etching solution.

What is claimed is:

1. A wiring substrate comprising:

a wiring;

a solder resist layer formed on the wiring and having an opening from which a part of the wiring is exposed;

a copper seed layer formed in the opening;

a copper layer formed on the seed layer and filling the opening up to a certain depth thereof; and a metal post erected on the copper layer, having an upper surface located at a position higher than an upper surface of the solder resist layer and including any one of nickel, silver and tin.

2. The wiring substrate according to claim 1, further comprising:

a base material, wherein the wiring is formed above the base material, and wherein a diameter of the metal post is smaller than a diameter of an opening end of the opening, and an upper surface of the copper layer around the metal post is lower than the upper surface of the solder resist layer.

3. The wiring substrate according to claim 2, wherein the base material has a first principal surface on which the wiring is formed and a second principal surface opposite to the first principal surface, and wherein the wiring substrate further comprises:

a land formed at the second principal surface-side and electrically connected to the wiring, and a metal layer formed on a surface of the land and having an ionization tendency smaller than copper.

4. A semiconductor device comprising:

a wiring;

a solder resist layer formed on the wiring and having an opening from which a part of the wiring is exposed a copper seed layer formed in the opening;

a copper layer formed on the seed layer and filling the opening up to a certain depth thereof;

a metal post erected on the copper layer, having an upper surface located at a position higher than an upper surface of the solder resist layer and including any one of nickel, silver and tin; and a semiconductor element connected to the upper surface of the metal post.

* * * * *